US008490799B2

(12) United States Patent
Knight et al.

(10) Patent No.: US 8,490,799 B2
(45) Date of Patent: Jul. 23, 2013

(54) SIX-POST TELECOMMUNICATIONS EQUIPMENT RACK

(75) Inventors: Paul Allan Knight, Spokane, WA (US); Steven W. Ellison, Mead, WA (US); Grayling A. Love, II, Liberty Lake, WA (US); Walter Dean Takisaki, Spokane Valley, WA (US)

(73) Assignee: Telect Inc., Liberty Lake, WA (US)

( * ) Notice: Subject to any disclaimer, the term of this patent is extended or adjusted under 35 U.S.C. 154(b) by 346 days.

(21) Appl. No.: 12/651,308

(22) Filed: Dec. 31, 2009

(65) Prior Publication Data

US 2011/0155674 A1    Jun. 30, 2011

(51) Int. Cl.
*H01H 7/183* (2006.01)
*H04Q 2201/02* (2006.01)

(52) U.S. Cl.
USPC .......................................................... 211/26

(58) Field of Classification Search
USPC ......... 211/26, 191, 192, 175, 189; 312/257.1, 312/265.1–265.5; 361/725, 726, 729, 735, 361/829
See application file for complete search history.

(56) References Cited

U.S. PATENT DOCUMENTS

| 5,801,632 | A | * | 9/1998 | Opal ............................. 340/585 |
| 6,036,290 | A | * | 3/2000 | Jancsek et al. ............. 312/265.4 |
| 7,310,234 | B2 | * | 12/2007 | Miller et al. ................... 361/752 |
| 7,495,169 | B2 | * | 2/2009 | Adducci et al. .................. 174/50 |
| 7,659,476 | B2 | * | 2/2010 | Hruby et al. ..................... 174/58 |
| 7,855,885 | B2 | * | 12/2010 | Adducci et al. ............... 361/692 |
| 8,035,965 | B2 | * | 10/2011 | Adducci et al. ............... 361/692 |
| 2002/0046979 | A1 | * | 4/2002 | Larsen et al. ..................... 211/26 |
| 2003/0062326 | A1 | * | 4/2003 | Guebre-Tsadik ............... 211/26 |
| 2004/0016708 | A1 | * | 1/2004 | Rafferty et al. .................. 211/26 |
| 2004/0050808 | A1 | * | 3/2004 | Krampotich et al. ........... 211/26 |
| 2005/0128722 | A1 | * | 6/2005 | Miller et al. ................... 361/797 |
| 2006/0268533 | A1 | * | 11/2006 | Miller et al. ................... 361/797 |
| 2007/0175836 | A1 | * | 8/2007 | Bumeder et al. ................ 211/26 |
| 2011/0155674 | A1 | * | 6/2011 | Knight et al. .................... 211/26 |

* cited by examiner

*Primary Examiner* — Jennifer E Novosad
(74) *Attorney, Agent, or Firm* — Lee & Hayes, PLLC

(57) ABSTRACT

Telecommunications equipment racks are described which are configured to occupy a minimum surface area, offer substantial strength while allowing substantial access to the interior of the rack. In one embodiment, a rack features a plurality of secondary and primary load bearing posts which are configured to allow substantial access to the interior of the rack. The rack may be further configured with a plurality of mountings to engage a plurality of telecommunications equipment within the interior of the rack.

12 Claims, 7 Drawing Sheets

SIX-POST TELECOMMUNICATIONS EQUIPMENT RACK

BACKGROUND

Telecommunications equipment is frequently stored in datacenters, central offices and remote huts. Datacenters, central offices and huts provide carefully controlled environmental conditions to accommodate sensitive telecommunications equipment from damage. Maintaining such a constant environment despite outside environmental fluctuations can often be costly. In turn, datacenters frequently charge significant fees for datacenter use. Frequently, the datacenter space is leased by the square foot or rack space. Thus, the less surface area a telecommunications rack covers, the lower the storage cost, and or the better utilization of the entire facility. Typical servers can weigh in the range of 50 pounds per rack unit, and mission critical backbone routers weigh over 500 pounds each. Due to the limited seismic capacity of today's typical racks, these critical network components are either housed in half filled racks or in full racks which exceed the seismic capacity of the rack.

As a result of the economic incentive to increase the density of telecommunications equipment per surface area unit, a greater weight will be place on each rack. Thus, not only is a rack with a minimal footprint needed, but a rack is needed that is also structurally strong enough to support a significant amount of telecommunications equipment during a catastrophic event such as an earthquake.

SUMMARY

Telecommunications equipment racks are described which are configured to occupy a minimum surface area, offer substantial strength while allowing substantial access to the interior of the rack. In one embodiment, a rack features a plurality of secondary and primary load bearing posts which are configured to allow substantial access to the interior of the rack. The rack may be further configured with a plurality of mountings to engage a plurality of telecommunications equipment within the interior of the rack. Also discussed is an optional cable manager and a method of creating the rack.

DETAILED DESCRIPTION

Overview

It should be noted that the following devices are examples and may be further modified, combined and separated without departing from the spirit and scope of this disclosure. As discussed above, floor space in datacenters is limited. This disclosure describes a telecommunications equipment rack that occupies a relatively small footprint, yet is able to securely hold substantial weight even under extreme conditions such as earthquakes.

Illustrative Rack

Figure 1:
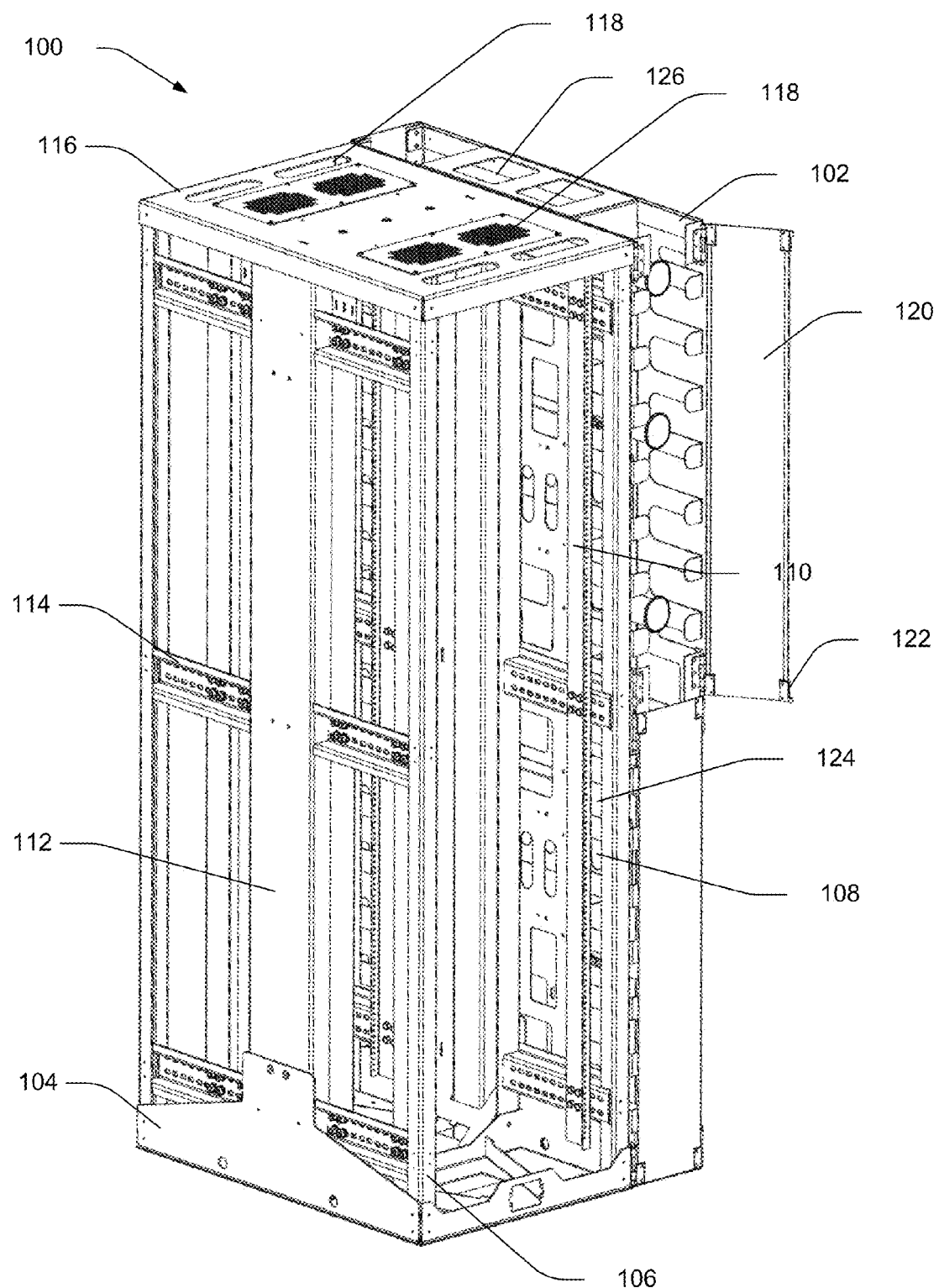
FIG. 1 illustrates an embodiment of a rack and cable manager.

FIG. 1 illustrates a perspective view of a non-limiting embodiment of rack 100 and an optionally attached cable manager 102. As illustrated, rack 100 may have a base 104. The base 104 may be rectangular or other shape. In one embodiment, the base 104 has a width of approximately 24 inches. This approximate measurement is used to mitigate datacenter leasing costs. Specifically, floor data center tiles typically have a width of approximately 24 inches. Thus, in many instances, datacenters use 24×24 inches tiles to calculate leasing charges. Thus, confining at least the width of the rack 100 to approximately 24 inches significantly lowers leasing expenses. In one embodiment, the height of the rack 100 is about 84 inches, the width of the rack is about 24 inches and the depth of the rack is about 36 inches. However, each of the dimensions may vary in other embodiments. If included, the optional cable manager 102 may be also be engaged to the base 104 as well as the sides of the rack.

Braces and other structural members may be added to the base 104 to increase structural integrity. In this embodiment, the base 104 is engaged with four upstanding secondary load bearing posts 106 (corner load bearing post). The secondary load bearing posts 106 may be engaged to the base 104 in a substantially upright manner. In this embodiment, the secondary load bearing posts 106 may be engaged to the base by bolts, welds, pins, tabs or other similar methods or a combination thereof. Also, in this embodiment, each corner of the base 104 will be engaged to one of the upstanding secondary posts 106. The height, width, depth and shape of the secondary load bearing posts 106 may vary as desired. For example in FIG. 1, the depth of the secondary load bearing posts 106 is about 2 inches (5 centimeters), the width of the secondary load bearing post is about 2.5 inches (6.4 centimeters) and the post may be in the shape of a corner section, L-shaped section, I-beam, rectangular tubes or other cross section shapes. This specific depth dimension allows sufficient space (via a rack pass through 108) to allow cables or other objects to pass through an opening created by the secondary load bearing posts 106 and the vertical mounting rail 110 (discussed further below).

FIG. 1 also shows interposed between two of the secondary load bearing posts 106, a primary load bearing post 112 (intermediate load bearing post). In this embodiment, a primary load bearing post 112 engages with the right side of the base 104 and another on the left side of the base 104. For instance in FIG. 1, two primary load bearing posts 112 are interposed between the secondary load bearing posts 106 on the left and right sides of the rack 100. Interposing the primary load bearing posts 112 on the right and left sides allows a large uninterrupted space to be presented to a user via the front and back of the rack 100. This allows convenient insertion of telecommunications equipment via rack units. In other embodiments, the number of secondary and/or primary load bearing posts may be varied on each side.

In addition, since the primary load baring posts 112 are positioned substantially in the middle of the right and left sides, they may have dimensions substantially larger than the secondary load bearing posts 106 without comprising the size of the rack pass through 108. The primary posts and secondary posts may be of various shapes and/or sizes or may be replaced by panels or other supporting structures.

Substantially horizontal rails 114 may also be added to the rack 100. These rails 114 may engage the secondary load bearing posts 106 to form a substantially right angle. The engagement may be via bolt, tab and slot, weld or other similar methods. These rails 114 may also engage the primary load bearing 112 posts to further increase the structural integrity of the rack 100. Both the base 104 and horizontal rails 114 serve to transfer stress from the secondary load bearing posts 106 to the primary load bearing posts 112. This transfer not only increases the racks structural integrity, but the transfer also is useful in minimizing the dimensions of the secondary load bearing posts 106. This allows substantial minimization of the dimensions of the secondary load being posts 106 (in particular the depth of the post) which allows an increase in the rack pass through space 108. In other embodiments, the substantially horizontal rails 114 may be replaced with diagonal rails or rails in any other orientation.

Horizontal rails 114 may also provide a plurality of mountings for a variety of components or mounting rails. The plurality of mountings may be configured in a variety of ways, including a variety of fasteners, mounting holes arranged in various patterns, different sized mounting holes, brackets and so forth.

An embodiment of the rack 100 may have a height of 84 inches, width of 24 inches and depth of 36 inches, and may include secondary load bearing posts with a depth of about 2 inches and a width of about 2.5 inches. This rack may be constructed out of 11 gauge steel resulting in a weight of 400 pounds and be capable of holding in excess of 2000 pounds of telecommunications equipment. In addition, the rack 100 of this embodiment is capable of structurally complying with Zone 4 seismic requirements. Specifically, in a Zone 4 geographic area, there is a one in ten chance of experiencing a seismic event having an acceleration level of 0.04 times that of gravity in the next fifty years. This compliance is possible via the stress transfer from the secondary load bearing posts to the primary load bearing posts 112. This embodiment yields about 17.5 inches of width at the front and back of the rack to allow equipment insertion and storage. In addition, there may be about 0.75 inches of width per left and right side to permit space for equipment mounting brackets which are mounted to equipment rails. From these dimensions, this embodiment results in 2.5 inches of width per left and right side for tolerances and for the corner and intermediate posts. These dimensions also allow enough room (via the 2 inch depth of the secondary load bearing posts) for cable access through rack pass through 108 into cable manager 102. In another embodiment, the width of the rack may be 23 inches. In yet another embodiment, the rack may have a depth of 42 inches. Various other combinations of these features and dimensions are also contemplated.

Vertical mounting rails 110 may be added by engaging them with the horizontal rails 114. In a manner similar to the horizontal rails 114, the vertical mounting rails 110 may also provide a plurality of mountings for a variety of components. The plurality of mountings may configured in a variety of ways, including a variety of fasteners, mounting holes arranged in various patterns, different sized mounting holes, brackets and so forth. Thus, via the mountings, the vertical rails 110 may be engaged with the horizontal rails 114. In turn, the vertical mounting rails 110 may be used to mount various pieces of telecommunications equipment or the like.

Vertical rails 110 may be engaged to the horizontal rails 114 in an adjustable manner. For instance, FIG. 1 illustrates vertical rails 110, which may be placed toward the front or back of the rack 100 in an adjustable manner via the various mountings on the horizontal rails 114.

Rack 100 may also include an optional lid 116. In an implementation, the lid 116 may overhang the body of the rack 100. This may provide overhead protection (e.g., from falling equipment etc.) to a technician/user accessing the rack 100. The lid 116 may be engaged to the secondary load being posts 106 and/or the primary load bearing posts 112 via bolts, welds, tabs, hinges, slots, or other methods.

The lid 116 may serve several roles. First, the lid 116 may serve as a weatherproof side of the rack 100. Seals (e.g., gaskets, o-ring, sealing strips and so forth) may be provided on the lid 116. In addition, weather proof sides may be added to the rack 100. Thus, a sealed enclosure (e.g., a weatherproof interior chamber) may be formed to protect equipment within the rack 100 from environmental influences if stored outside of the controlled environment of a data center. In addition, at least one of the sides may be hingedly attached to form a door. It is contemplated that alternative arrangements may employ sides as well as the lid configured as removable panels, sliding doors, foldable doors, and so on.

Second, the lid 116 may serve to house a pass through(s) 118. Specifically, the lid 116 may feature pass throughs 118 for cables or other objects. As illustrated in FIG. 1, pass throughs 118 may take several forms. The pass through may be a simple slot though the lid 116, a square or other shapes. In addition, the pass through 118 may feature a weather proof cover. The pass throughs 118 may initially feature knock-outs in which a user may remove to create a pass through which may also be used with a weather proof cover.

Third, the lid 116 may serve as a structural member. As illustrated in FIG. 1, the lid 116 may engage with the secondary and/or primary load bearing posts. As weight or stress from an earth quake or similar event is input to the rack 100, the lid 116 may aid in transferring stress from the secondary bearing posts 106 onto the primary load bearing posts 112.

Not illustrated are rack side covers that may serve to provide protection to the equipment housed inside the rack. The side covers may be hard sides made of metal, plastic or other material. Alternatively the side covers may be made of flexible material such as plastic or other flexible materials. The side covers may be engaged to the secondary 106, primary load bearing posts 112, the lid 116, base 104, horizontal rails 114, vertical rails 110 or any combination of these structures. The sides may also serve to transfer stress from the secondary load bearing posts 106 to the primary load bearing posts 112. Alternatively, the rack 100 may be enclosed within a separate enclosure whose sides and top may not be directly engaged with the rack 100.

FIG. 1 also illustrates an optional cable manager 102. The cable manager provides a protected space to store excess cable lengths or other objects, route cables between racks and provide ventilation between racks or other objects/structures such as walls. In one embodiment, one or more of areas in the interior of the cable manager 102 may be used for cable routing and/or, for support equipment such as cooling fans. Utilizing the areas as described for cable runs and/or additional support equipment helps in maximizing the amount of efficiently utilized space in an organized and protected manner.

The cable manager 102 may be a standalone device near the rack 100 or maybe optionally engaged to the rack 100. As illustrated, the cable manager 102 is of a substantially similar height and depth as the rack 100. Also, as illustrated, the cable manager 102 is approximately eight inches in width. Various other dimensions can be implemented as desired. For instance, the cable manager 102 may be substantially larger or smaller than the rack in each dimension.

If the cable manager 102 is engaged to the rack 100, the engagement may be via nuts and bolts, slots and tabs, welds or other methods. The engagement may be along the base 104 of the rack 100, the horizontal rails 114, the vertical rails 110, the lid 116 or a combination thereof. The engagement may further be at single or multiple separate attachment points of the aforementioned structures. In another embodiment, the cable manager 102 may be placed and engaged between two racks.

In some embodiments, the front of the cable manager 102 may include doors 120. As illustrated, the doors 120 feature hinges 122 with hinge pull pins. This allows the door 120 to swing on a plurality of sides depending which pin is pulled. This is particularity useful if the cable manager 102 is placed between two racks. For instance, when servicing a rack on the left side of the cable manager, it may be more convenient to have the cable manger door 120 open on the right hinge. Alternatively, if servicing a rack on the right of the cable manger, it may be more convenient to swing the cable manager door 120 open on the left side of the cable manager 102. As illustrated, a plurality of doors may be added to the front of the cable manager to accommodate different portions of the rack 100. In addition, doors may be added both to the front and back of the cable manager to increase access to objects stored within. The door may be created from any suitable material such as metal, plastic, or a combination of such materials. In one embodiment, the doors themselves may feature apertures to mount objects or to serve as pass throughs. Additionally, the door may feature windows and/or indicia.

As introduced above, the cable manager 102 may serve as a space to store objects. For instance, excess cable from the rack may be routed to the cable manager 102 to keep the interior of the rack organized. This provides clear access (e.g., access unobstructed by the rack, posts, doors, telecommunications equipment in rack units and so forth) to the objects stored within the cable manager 102. Time, cost and complexity associated with set-up and upkeep of telecommunication equipment may all accordingly be reduced.

FIG. 1 also illustrates a plurality of cable manager apertures 124 on the sides, front and back of the cable manager 102. This allows objects such as cables to be routed and stored in the cable manager 102 from the interior or exterior of a rack 100. In another embodiment, the space within the cable manager 102 in between two racks may be used as space to route a cable(s) or other objects from one rack to another rack. In one embodiment, excess cabling from a plurality of racks may be stored in a single cable manager.

The aperture 124 may be spaced vertically and horizontally so as to align with rack pass through 108 as well as other spaces on the side/top/bottom of the rack 100. In one embodiment, at least one of the side surfaces of the cable manager 102 has a plurality of apertures 124 formed along its vertical length to align with rack pass through 108.

Cable manager aperture 124 may created in any suitable shape and size. As illustrated, the apertures 124 are created from fingers that are bent to form portions of the front back and sides of the cable manager 102. In the embodiment shown, apertures 124 in the form of fingers are provided along the vertical length of the cable manager's front, back and sides. These fingers help retain the slack fibers and prevent them from protruding into the interior of the rack 100.

FIG. 1 also illustrates upper cable manager aperture 126. This aperture may be created to route cables from the interior of a rack that is engaged with another rack or cable manager 102. Not shown is an optional bottom cable manager aperture. This aperture may be created on the bottom surface of the cable manager. This may allow cables to be routed to another cable manager and/or rack via removable floor tiles or other similar methods. The base may also feature at least one fiber channel (not shown) which can be used to route and protect fibers going to or from the racks to a cable manager 102 or another rack 100.

As illustrated, cables and other objects may be first routed out of the interior of the rack 100 via rack pass through 108. The rack pass through 108 may be created in between the space of the vertical mounting rails 110 and the secondary load bearing post 106. As discussed above, in one embodiment, since the secondary load bearing post's depth does not exceed two inches, the size of the rack pass through 108 is greatly enhanced. This is particularly important when the vertical mounting rail 110 is positioned to accommodate rack units of telecommunications equipment. Thus, the combination of the relatively small depth of the secondary load bearing posts 106 and the primary load bearing post's significant structural contribution results in a rack that has high structural integrity, while allowing for relatively large spaces for cables and other objects to pass out of the interior of the rack via the sides of the rack. This is a significant advantage over previous rack designs using only four posts. Specifically, in order to achieve similar strength (e.g., to comply with Zone 4 seismic requirements while bearing 2000 pounds), significant use of trusses were used. These additional side structural members made routing objects out of the sides of the rack difficult or impossible. Also, the thickness of the structural members in these previous embodiments was substantially greater-making them extremely heavy.

In one embodiment, cable manager 102 may in a similar manner to the rack 100, feature weatherproof/tamperproof sides, top and bottom. In addition, the cable manager 102 and the rack 100 may both be enclosed within the same weather tight enclosure.

The cable manager 102 may also serve to enhance the structural soundness of the rack 100. For instance, the cable manager 102 may be engaged to the rack 100 in such a manner to distribute stress over a larger surface area of the ground as opposed to the surface area of the rack 100 alone. The cable manager 102 may also accomplish a similar function when attached to a plurality of racks. For instance, stress from one rack may be transferred to the cable manager 102 which in turn may transfer stress to another engaged rack; thus distributing stress over an even larger surface are of the ground.

A rack refers to a structure to maintain or hold a plurality of telecommunications equipment (which may be attached via rack units) and may be configured in a variety of ways. For example, the rack may be configured as an enclosure for one or more terminal blocks, connection panels, a protector blocks, digital cross-connects, switches, hubs or other telecommunications equipment. The rack 100 may be inside a building or housing or may itself be configured to be placed outside, e.g., an outside plant cabinet. The racks may typically be configured to protect their contents from environmental influences.

For instance, a rack may be configured for application at an outside plant site. In other words, the rack may be configured as an outside plant cabinet. An outside plant cabinet, as the name suggests, is located outside and is configured to protect the contents of the rack from environmental influences (e.g., heat, cold, wind, rain and so forth). Devices and techniques described herein may be configured for indoor and outdoor applications alike.

Figure 2:
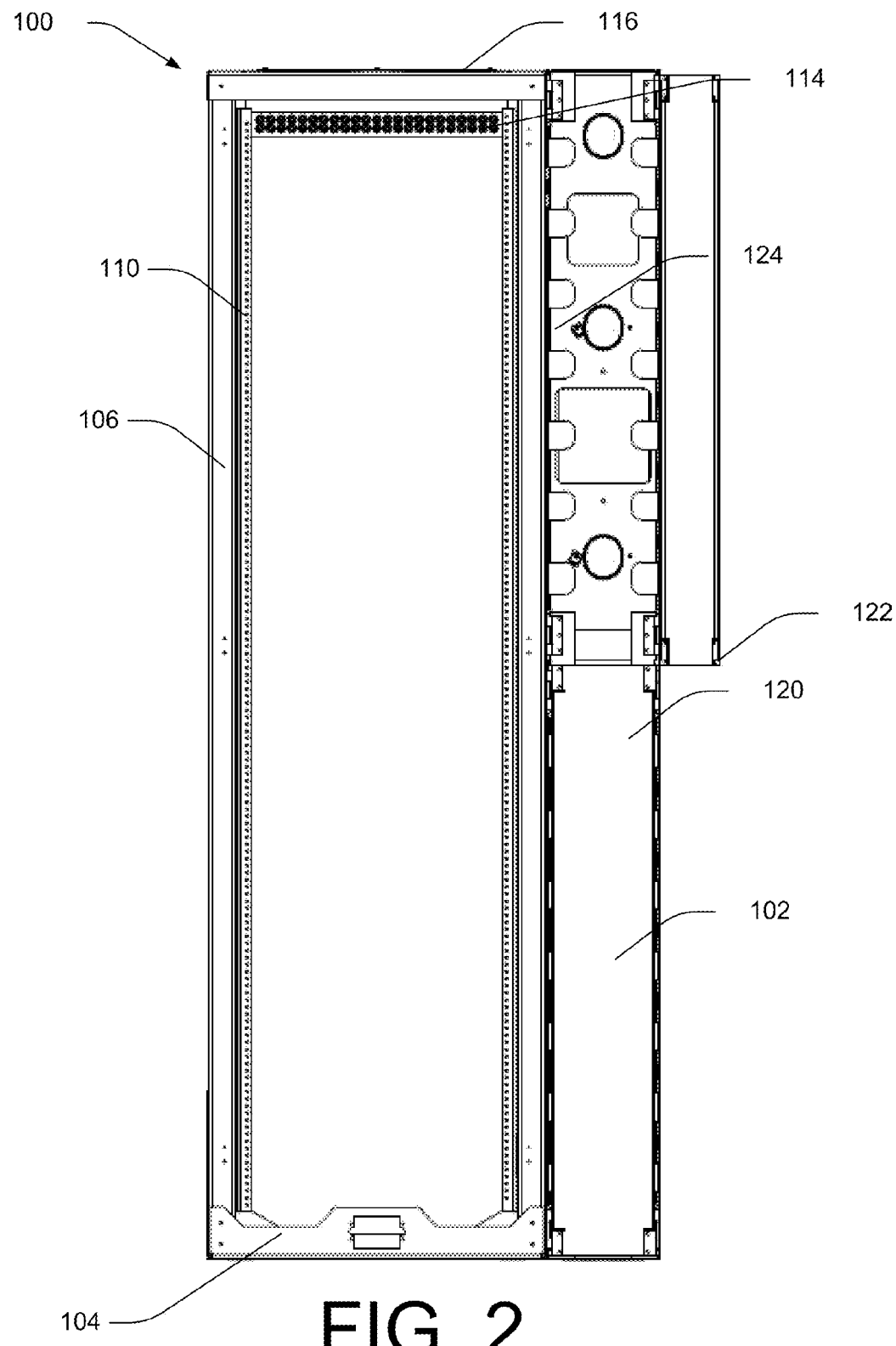
FIG. 2 illustrates a front view of an exemplary implementation of the rack of FIG. 1.

FIG. 2 illustrates a front view of rack 100. As illustrated, the rack 100 may include a horizontal rail 114, which extends from the left front secondary load bearing post to the right front secondary load bearing post. This not only adds a rail to mount equipment, but also further increases the structural integrity of the rack 100. FIG. 2 also illustrates the cable manager 102 having a width of eight inches. In other embodiments, the cable manager 102 may be sized as desired. For instance, the cable manager 102 may be only half the height of the rack 100. The cable manager 102 may then be mounted adjacent the rack to either the top half, lower half or an intermediate position of the rack 100. Various other sizes and mounting arrangements are also contemplated.

Figure 3:
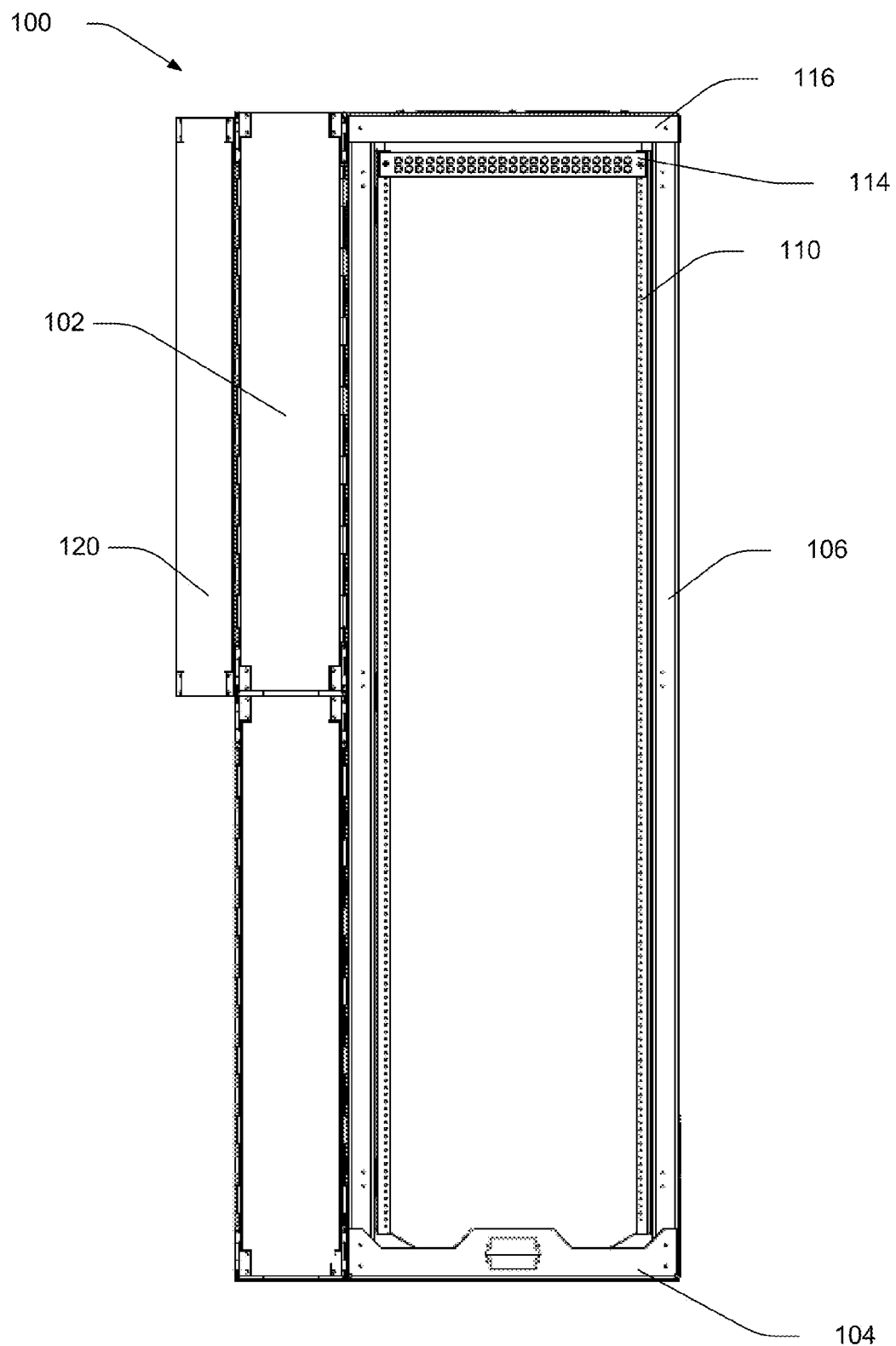
FIG. 3 illustrates a back view of an exemplary implementation of the rack of FIG. 1.

FIG. 3 illustrates a back view of the rack 100. As discussed above, the cable manager 102 may feature doors 120 both on the front and backsides of the cable manager 102. In other embodiments, a single door can be included instead of two doors on the back or front side. Various other combinations are also contemplated.

Figure 4:
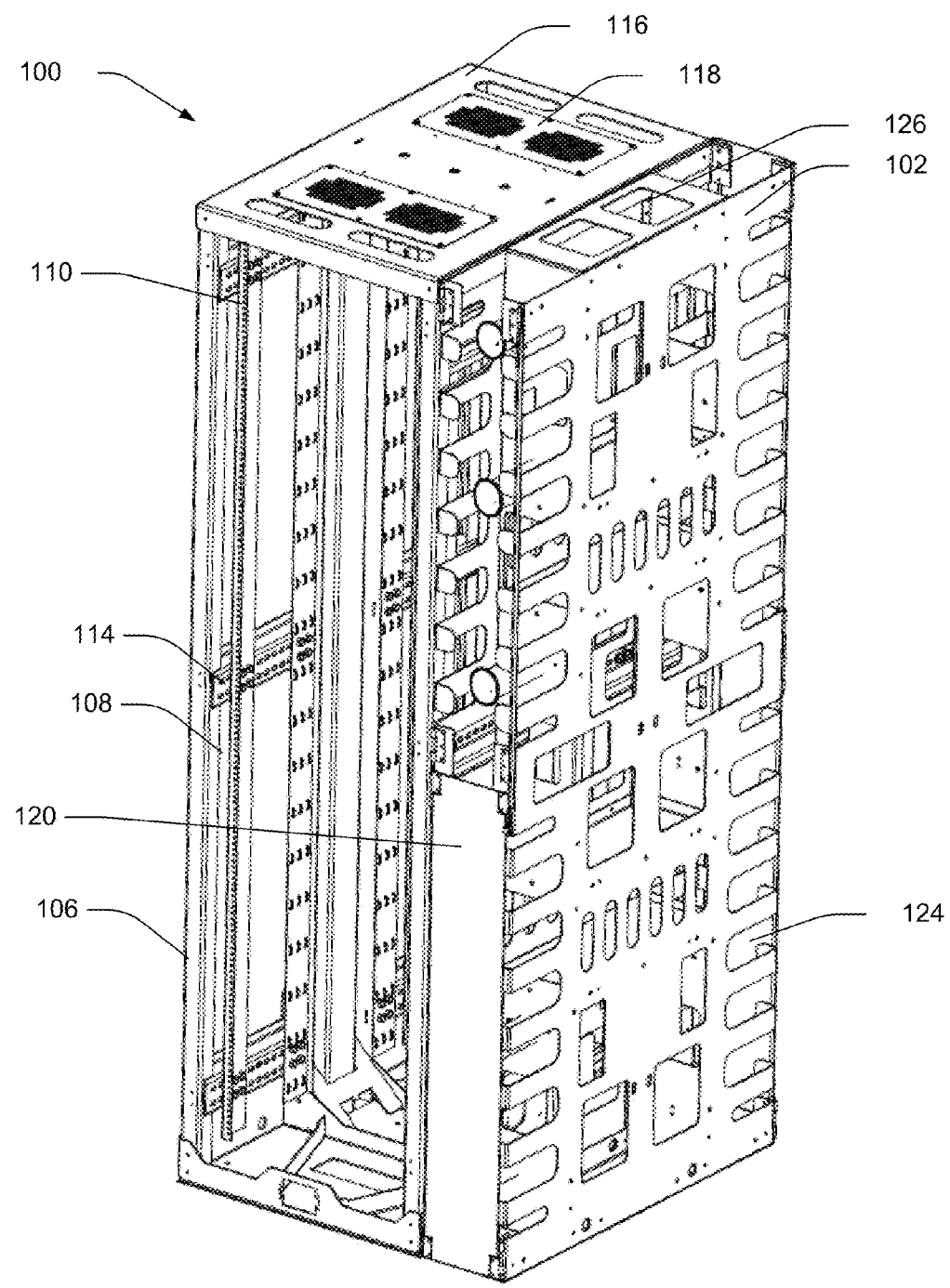
FIG. 4 illustrates another perspective of an embodiment of a rack and cable manager.

FIG. 4 illustrates another perspective view of the rack 100 and the cable manager 102. As illustrated, the doors 120 may swing either toward the rack 100 or away from the rack 100. As discussed above, the cable manger 102 may be constructed of various lengths, widths and heights. As illustrated, cable manager apertures 124 may come in different shapes and sizes. Examples may be slots, squares, rectangles, circular or oval apertures or other shapes.

Figure 5:
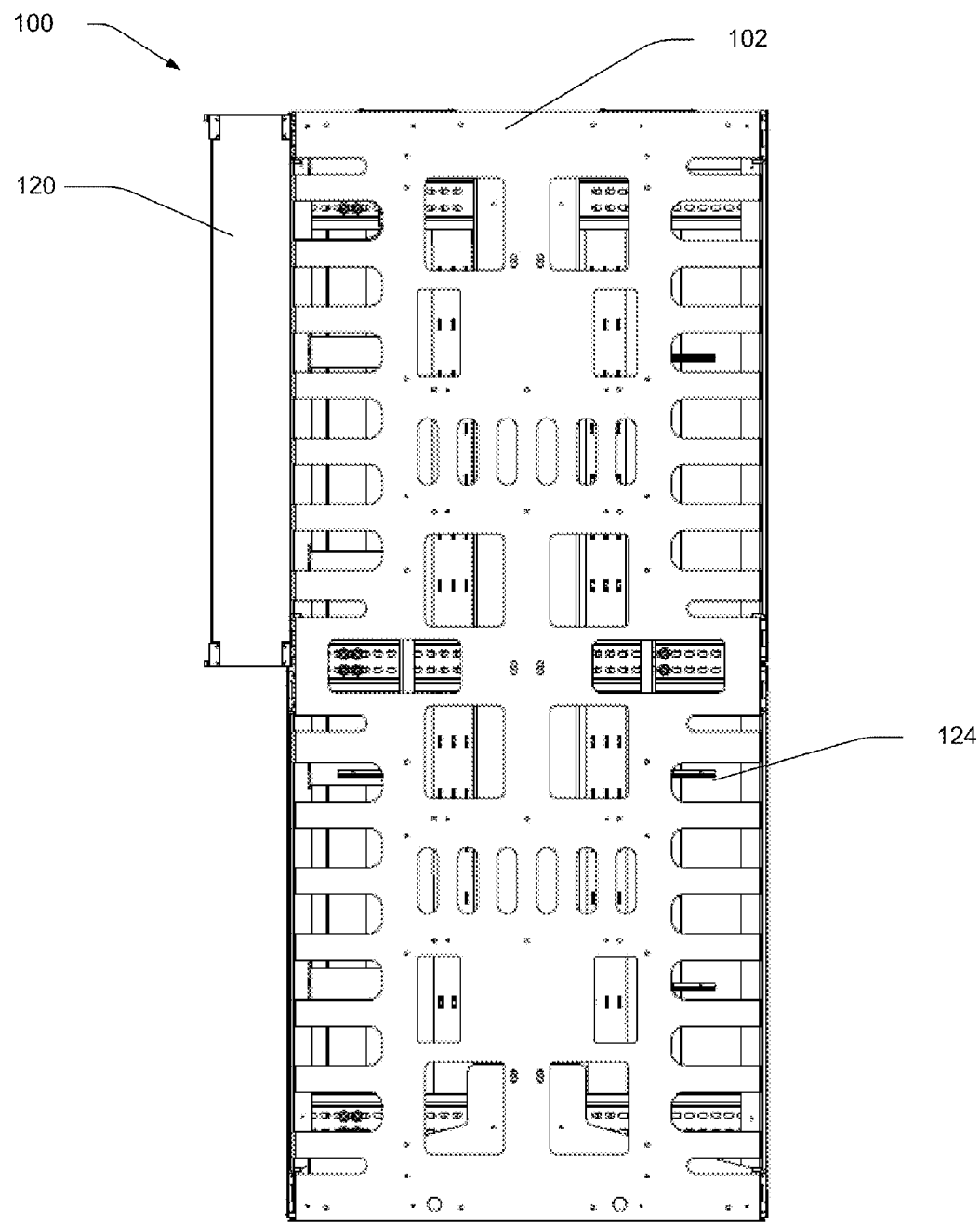
FIG. 5 illustrates a left side view of an exemplary implementation of the rack of FIG. 1.

FIG. 5 illustrates a side view of the rack 100 with a cable manger 102 attached.

Figure 6:
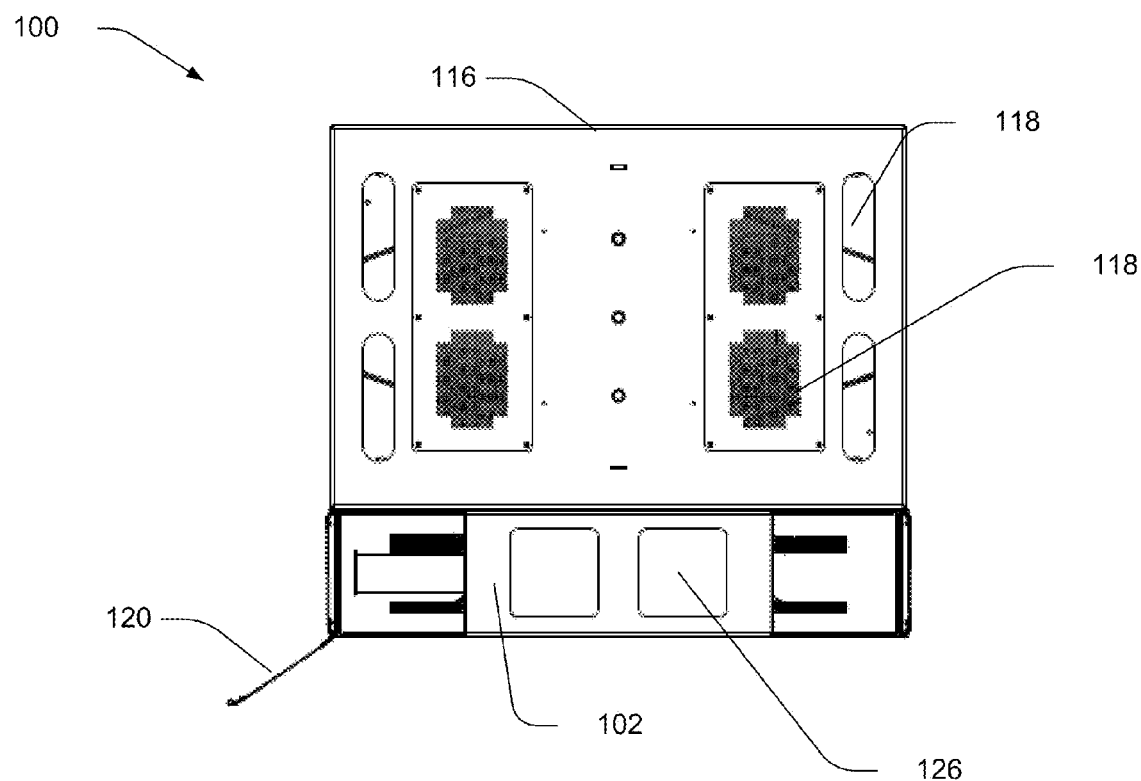
FIG. 6 illustrates an overhead view of an exemplary implementation of the rack of FIG. 1.

FIG. 6 illustrates a top view of the rack 100 with an attached cable manager 102. As discussed above, upper cable manager apertures 126 as well as lid pass though 118 may come in a variety of forms. In addition the upper apertures 126 may be covered when not in use to form a weather tight surface. In other embodiments, the cable manager apertures 124 and the pass throughs 118 may also be covered to form a weather tight surface.

Illustrative Fabrication

The following discussion describes techniques that may, but not necessarily be implemented utilizing the previously described systems and devices. The procedures are shown as a set of blocks that specify operations performed and are not necessarily limited to the orders shown for performing the operations by the respective blocks.

Figure 7:
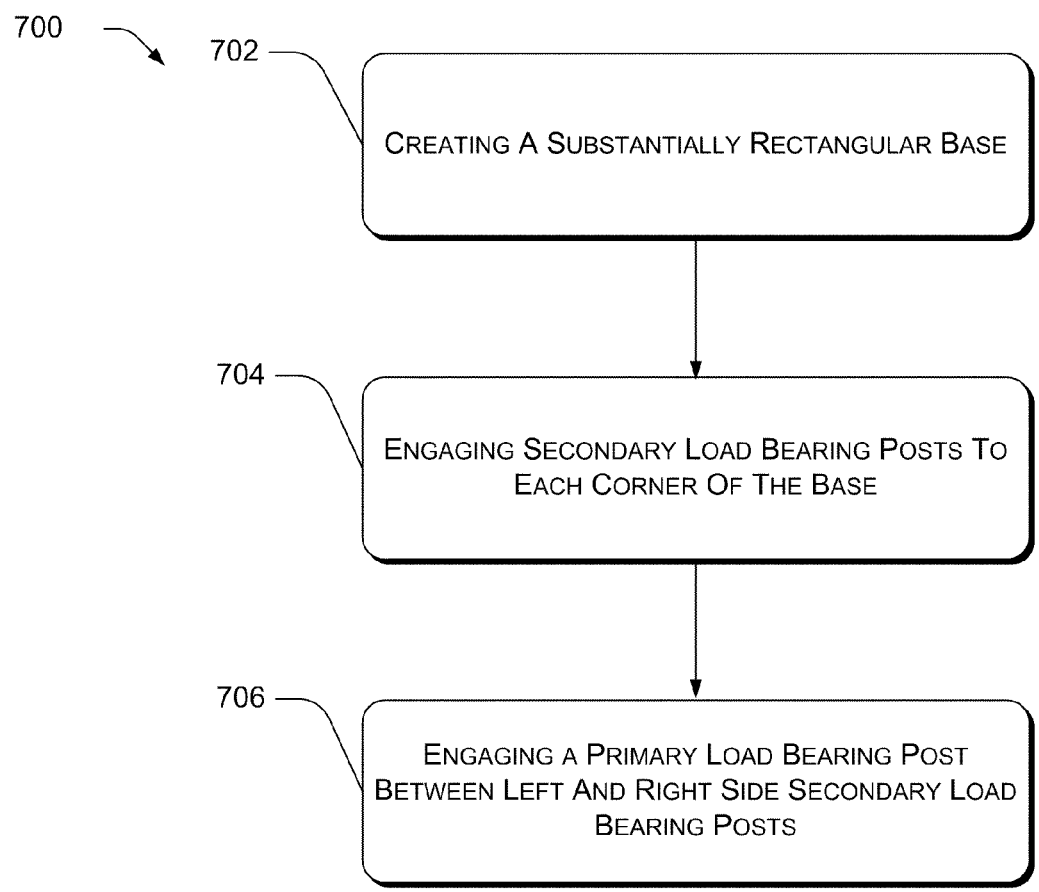
FIG. 7 is a flow diagram depicting a procedure for fabricating a rack.

FIG. 7 depicts a procedure 700 in an exemplary implementation in which a telecommunication equipment rack 100 having six posts is formed. First, a substantially rectangular base 104 is formed for the rack (block 702). The base may have a variety of shapes in other embodiments. The base may be reinforced with trusses or other means to add structural integrity.

A secondary load bearing post 106 is then engaged to each corner of the base 104 (block 704). These function as load transferring members to the primary structures 112. Specifically, positioning the secondary load bearing posts 106 (and limiting their depth to approximately 2 inches) in the corners provides a relatively smaller member in each of the corners of the base 104 to facilitate access/egress into and out of the interior of the rack. Simultaneously, the secondary load bearing post 106 provides a substantial transfer of stress from the corners of the base 104 to the relatively larger primary load bearing members 112 (discussed further below). Typically, the secondary load bearing posts 106 are engaged in a substantially upright manner to facilitate insertion of telecommunications equipment rack units.

A primary load bearing post 112 is then engaged in between two secondary posts 106 (block 706). In one embodiment, a primary load bearing post 112 may be engaged to the base 104 in between the secondary posts 106 on the right and left sides of the base 104. This provides enhanced access to the front and back of the rack 100 while adding significant structural integrity to the rack 100. In addition, the combination of relatively smaller secondary load bearing posts 106 with larger primary load bearing posts 112 provides significant access to the interior of the rack via rack pass through 108. In other embodiments, a third primary load bearing post may be added to the back of the base 104. In other embodiments, the primary posts 112 may be reconfigurable via nut and bold, slot and tab or other methods.

In addition, stress may be transferred from the secondary 106 to the primary 112 load bearing posts via horizontal rails 114 and a lid 116. These additional structural elements may be reconfigurable to suite fluctuating requirements. Furthermore, vertical rails 110 may be added by engaging them with the horizontal rails 114. Thus the, structure which is generally the skeleton of the rack 100 as depicted in FIG. 1 may be formed which is configured with a plurality of mountings for telecommunications equipment. In one embodiment, the horizontal 114 and vertical 110 rails are configured with a plurality of mountings for telecommunications equipment.

The components of the rack 100 can be made of any material having the desired combination of strength, cost, weight, electrical conductivity, and other material properties, and can be made by conventional manufacturing and assembling processes. Several suitable materials include, for example, metals, plastics, polymers, composites, and the like.

Conclusion

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. A telecommunications equipment rack comprising:
   a substantially rectangular base defining:
     a front side of the rack;
     a rear side of the rack;
     a left side of the rack; and
     a right side of the rack;
   four upstanding corner load bearing posts, each engaged to a respective corner of the base, the respective corners collectively defining a perimeter of the rack;
   an upstanding intermediate load bearing post engaged to the base and interposed between each of the two corner load bearing posts on the left side of the rack;
   an upstanding intermediate load bearing post engaged to the base and interposed between each of the two corner load bearing posts on the right side of the rack;
   a plurality of horizontal beams that are each engaged to at least one of the corner load bearing posts and at least one of the intermediate load bearing posts, the plurality of horizontal beams not engaged to the base of the rack and configured to transfer stress from the corner load bearing posts to the intermediate load bearing posts; and
   a vertical rail removably coupled to one of the plurality of horizontal beams, the vertical rail being a different member than the intermediate load bearing posts and configured to mount a telecommunications equipment to the rack.

2. The telecommunications equipment rack of claim 1, wherein each of the upstanding intermediate load bearing posts is a primary load bearing post, and each of the four upstanding corner load bearing posts is a secondary load bearing post, the secondary load bearing posts bearing less load than the primary load bearing posts.

3. The telecommunications equipment rack of claim 1, further comprising a cable manager configured to engage to one of the sides of the rack, the cable manger comprising:

a back side;
a left side and a right side, wherein at least the left and/or right side is configured with a cable aperture; and
a front side.

4. The telecommunications equipment rack of claim 1, wherein a width of the front side of the rack does not exceed about 24 inches (60 centimeters).

5. The telecommunications equipment rack of claim 1, wherein the depth of each corner load bearing post does not exceed about two inches (five centimeters).

6. The telecommunications equipment rack of claim 1, wherein the rack meets Zone 4 seismic specifications.

7. The telecommunications equipment rack of claim 1, wherein the rack is configured to bear a load of at least about 2000 pounds (907 kilograms).

8. The telecommunications equipment rack of claim 1, wherein the rack is enclosed in a weather-tight enclosure that is sealable to protect the interior of the enclosure from environmental influences at an outside plant location.

9. The telecommunications equipment rack of claim 1, wherein the rack has a weight of at most about 400 pounds.

10. The telecommunications equipment rack of claim 1, wherein the rack has a weight of at most about 400 pounds and meets Zone 4 seismic specifications.

11. The telecommunications rack of claim 1, wherein the two corner load bearing posts on the left side and the intermediate load bearing post on the left side are substantially coplanar, and the two corner load bearing posts on the right side and the intermediate load bearing post on the right side are substantially coplanar.

12. The telecommunications rack of claim 1, wherein the intermediate load bearing post on the left side is substantially equidistance from the front corner load bearing post and the rear corner load bearing post on the left side, and the intermediate load bearing post on the right side is substantially equidistance from the front corner load bearing post and the rear corner load bearing post on the right side.

* * * * *